United States Patent
Sakai et al.

(10) Patent No.: US 8,518,300 B2
(45) Date of Patent: Aug. 27, 2013

(54) β-SIALON PHOSPHOR POWDER AND PRODUCTION METHOD THEREOF

(75) Inventors: Takuma Sakai, Yamaguchi (JP); Shin-ichi Sakata, Yamaguchi (JP)

(73) Assignee: Ube Industries, Ltd. (JP)

( * ) Notice: Subject to any disclaimer, the term of this patent is extended or adjusted under 35 U.S.C. 154(b) by 609 days.

(21) Appl. No.: 12/682,358

(22) PCT Filed: Oct. 6, 2008

(86) PCT No.: PCT/JP2008/068512
§ 371 (c)(1),
(2), (4) Date: Apr. 9, 2010

(87) PCT Pub. No.: WO2009/048150
PCT Pub. Date: Apr. 16, 2009

(65) Prior Publication Data
US 2010/0213820 A1    Aug. 26, 2010

(30) Foreign Application Priority Data
Oct. 10, 2007   (JP) .................................. 2007-264007

(51) Int. Cl.
*H01L 33/00* (2010.01)
(52) U.S. Cl.
USPC ........ 252/301.4 F; 257/98; 313/503; 313/486
(58) Field of Classification Search
USPC ............. 252/301.4 F; 313/503, 486; 257/98
See application file for complete search history.

(56) References Cited

U.S. PATENT DOCUMENTS

| 7,815,817 | B2 * | 10/2010 | Hirosaki ................ 252/301.4 F |
| 2007/0108896 | A1 | 5/2007 | Hirosaki |
| 2007/0210692 | A1 | 9/2007 | Yokosawa et al. |

FOREIGN PATENT DOCUMENTS

| EP | 0 155 047 A1 | 9/1985 |
| JP | 60-206889 A | 10/1985 |
| JP | 9-040406 A | 2/1997 |
| JP | 2005-255895 A | 9/2005 |
| JP | 2006-052337 A | 2/2006 |
| JP | 2006-321921 A | 11/2006 |
| JP | 2007-39591 A | 2/2007 |
| JP | 2007-224083 A | 9/2007 |
| WO | 2006/101095 A1 | 9/2006 |
| WO | WO 2006/101095 | * 9/2006 |

OTHER PUBLICATIONS

Xie et al, Synthesis and Photoluminescence Propeties of beta-sialon:Eu2+ (Si6-zAlzOzN8-z:Eu2+), Jour. electrochem. Soc., 154, 10, Aug. 15, 2007, pp. J314-J319.*

Shimamura, T. et al., "Preparation and Developments of Silicon Nitride and Its Related Powders by Imide Decomposition Method," *Powder Science and Engineering*, 1989, vol. 21, No. 8, pp. 36-46, with English translation of Abstrat (1 page).

R.-J. Xie, et al., "Synthesis and Photoluminescence Properties of β-sialon.$Eu^{2+}$ ($Si_{6-2}$)$Al_2O_2N_{8-2}Eu^{2+}$) A Promising Green Oxynitride Phosphur for White Light-Emitting Diodes," *Journal of the Electrochemical Society*, vol. 154, Aug. 15, 2007, pp. J314-J319.

N. Hirosaki et al., "Characterization and properties of green-emitting β-SiAlON:$Eu^{9+}$ powder phosphors for white light-emitting diodes," *Applied Physics Letters, American Institute of Physics*, vol. 86, Jan. 1, 2005, pp. 211905-1.

* cited by examiner

*Primary Examiner* — Carol M Koslow
(74) *Attorney, Agent, or Firm* — DLA Piper LLP (US)

(57) ABSTRACT

A β-sialon phosphor particle in which Eu (europium) is solid-soluted in a crystal having a β-type $Si_3N_4$ crystal structure, wherein the median diameter ($D_{50}$) in the particle size distribution curve of the primary particle is from 3.0 to 10 μm and the aspect ratio is less than 1.5.

9 Claims, 2 Drawing Sheets

β-SIALON PHOSPHOR POWDER AND PRODUCTION METHOD THEREOF

RELATED APPLICATIONS

This application is a §371 of International Application No. PCT/JP2008/068512, with an international filing date of Oct. 6, 2008 (WO 2009/048150 A1, published Apr. 16, 2009), which is based upon and claims the benefit of priority from Japanese Patent Application No. 2007-264007, filed on Oct. 10, 2007, the disclosure of which is incorporated herein by reference.

TECHNICAL FIELD

This disclosure relates to a β-sialon phosphor powder having a β-type $Si_3N_4$ crystal structure, and its production method and applications. More specifically, the disclosure relates to a phosphor powder composed of a rare earth-activated β-sialon phosphor particle having a special particle form and being improved in the fluorescence intensity, and its production method and applications.

BACKGROUND

A β-sialon phosphor activated with a rare earth element has been reported in Kokai (Japanese Unexamined Patent Publication) No. 60-206889. This β-sialon phosphor emits a green fluorescence at 525 to 545 nm by the excitation of ultraviolet light at 315 nm or less. Recently, studies are being aggressively made on a white light emitting diode using a near-ultraviolet-to-blue light emitting diode as the excitation source, and a phosphor capable of strongly emitting light with this excitation wavelength is demanded. The green light emitting β-sialon phosphor also requires a green fluorescence strongly emitting with the above-described excitation wavelength range. However, the phosphor described in Kokai No. 60-206889 is difficult to be applied, because the optimal excitation wavelength is present in the ultraviolet region. On the other hand, it has been reported in Kokai No. 2005-255895 that a β-sialon phosphor becomes a material capable of emitting a strong green fluorescence by the excitation of near ultraviolet-to-blue light. This phosphor is usable for a fluorescent display tube (VFD), a field emission display (FED), a plasma display panel (PDP), a cathode ray tube (CRT), a white light emitting diode (LED) and the like and is expected as a phosphor causing little reduction of brightness. Incidentally, in Kokai No. 2005-255895, a substantially acicular β-sialon phosphor is only disclosed.

SUMMARY

The fluorescence intensity of the β-sialon above is, however, still insufficient and a β-sialon phosphor assured of higher brightness is expected. This disclosure provides a higher-brightness β-sialon phosphor usable for a fluorescent display tube (VFD), a field emission display (FED), a plasma display panel (PDP), a cathode ray tube (CRT), a light emitting diode (LED) and the like.

As a result of intensive studies to solve the above-described problems, we have succeeded in reducing the aspect ratio (ratio of long axis/short axis) of the β-sialon phosphor particle and found that a β-sialon phosphor particle having an aspect ratio in a specific range has excellent fluorescence intensity. The disclosure has been accomplished based on this finding.

That is, the disclosure relates to a β-sialon phosphor particle in which Eu (europium) is solid-soluted in a crystal having a β-type $Si_3N_4$ crystal structure, wherein the aspect ratio of the particle is less than 1.5. The β-sialon phosphor is preferably represented by the formula: $Si_{6-z}Al_zO_zN_{8-z}$:$Eu_x$ (wherein $0<z<4.2$ and $0.005<x<0.08$).

The disclosure also relates to a β-sialon phosphor powder containing the above-described β-sialon phosphor particle, wherein the β-sialon phosphor powder does not contain a phosphor particle having an aspect ratio exceeding 2. That is, the disclosure relates to a β-sialon phosphor powder composed of β-sialon phosphor particles in which Eu is solid-soluted in a β-type $Si_3N_4$ crystal structure and having an aspect ratio of 2 or less, wherein the β-sialon phosphor powder does not contain a phosphor particle having an aspect ratio exceeding 2.

In the β-sialon phosphor powder, the average aspect ratio is preferably less than 1.5. Furthermore, in the β-sialon phosphor powder, the median diameter ($D_{50}$) in the particle size distribution curve is preferably from 3.0 to 10 µm.

The disclosure also relates to a method for producing a β-sialon phosphor powder, comprising mixing an α-type silicon nitride particle having a particle diameter of 2 µm or more and an aspect ratio of 1.3 or less, a substance containing AlN and serving as an aluminum source, and an oxide of Eu or a precursor substance capable of changing into an oxide of Eu upon thermal decomposition, to satisfy the formula: $Si_{6-z}Al_zO_zN_{8-z}$:$Eu_x$ (wherein $0<z<4.2$ and $0.005<x<0.08$), and firing the mixture at 1,700 to 2,100° C. in a nitrogen atmosphere at 0.05 to 100 MPa.

In the above-described method for producing a β-sialon phosphor powder, a washing treatment in a solution containing an acid is preferably applied after the firing. Furthermore, after the firing, a heat treatment is preferably performed within a temperature range of 300 to 1,000° C. in an atmosphere containing one member or two or more members selected from nitrogen, ammonia and hydrogen.

The disclosure also relates to a lighting apparatus composed of an LED capable of emitting light at a wavelength of 300 to 500 nm and the above-described β-sialon phosphor powder that is disposed to absorb light of the LED. The disclosure also relates to an image display device composed of an excitation source and the above-described β-sialon phosphor powder. The excitation source includes an electron beam, an electric field, a vacuum ultraviolet ray and an ultraviolet ray.

A β-sialon phosphor particle having a small aspect ratio can be produced by a specific production method. Also, by using a β-sialon phosphor particle having a small aspect ratio obtained by this method, a high-brightness phosphor can be provided.

DETAILED DESCRIPTION

Figure 1A:
FIG. 1A is a scanning electron micrograph showing particles of α-type silicon nitride as a raw material in Example 1.

We have found that when granular α-type silicon nitride by far larger than the conventional α-type silicon nitride is used as a raw material of a β-sialon phosphor, a β-sialon phosphor having a small aspect ratio and a large particle diameter can be synthesized.

In the crystallization of normal β-sialon, other raw material components such as silicon nitride are dissolved in a liquid phase component produced at a high temperature, and nucleation and growth proceed therein. The β-sialon belongs to a hexagonal system and has a property tending to become a columnar crystal due to strong anisotropy of the crystal. Reflecting the property inherent in the crystal, the β-sialon grown from a liquid phase becomes a columnar-acicular euhedral crystal having a large aspect. Particularly, in the case of producing a β-sialon as a phosphor, an element serving as a light emission source needs to be added and as compared with the production of normal β-sialon, a liquid phase is readily produced, as a result, the shape is liable to become columnar-acicular. Accordingly, in a normal production method, as seen from FIG. 2 of JP Kokai No. 2005-255895, columnar-acicular crystal grains having a large aspect ratio is obtained. It is very difficult to produce a powder not containing particularly a columnar-acicular crystal at all.

The disclosure is described in detail below. The β-sialon phosphor particle is a β-sialon phosphor particle in which Eu is solid-soluted in a crystal having a β-type $Si_3N_4$ crystal structure, wherein the aspect ratio (ratio of long axis/short axis) is less than 1.5. The aspect ratio is preferably 1.3 or less. The β-sialon phosphor particle is obtained by forming a solid solution of Eu serving as an emission center, in a compound composed of Si, Al, O and N and represented by the formula: $Si_{6-z}Al_zO_zN_{8-z}$ (wherein 0<z<4.2) (the crystal structure is described, for example, in ICSD, No. 34286), and is represented by the formula: $Si_{6-z}Al_zO_zN_{8-z}:Eu_x$. The value of z is preferably from 0.3 to 2.0, more preferably from 0.3 to 1.0, and within this range, strong fluorescence is obtained. This phosphor having formed therein a solid solution of Eu is excellent in the green light emission characteristics. The range of x is from 0.005 to 0.08, preferably from 0.008 to 0.06. The β-sialon phosphor is characterized in that the aspect ratio is small as compared with the conventional β-sialon phosphor. In particular, the β-sialon phosphor particle with an aspect ratio of less than 1.5 cannot be produced as a conventional phosphor and is a novel phosphor particle. Such a phosphor having a small aspect ratio has high fluorescence intensity as compared with the conventional phosphor particle.

Also, the β-sialon phosphor powder is a powder containing the above-described β-sialon phosphor particles, and this is a powder containing the above-described β-sialon phosphor particles having an aspect ratio of less than 1.5, preferably 1.3 or less, in a large ratio. This powder is preferably a β-sialon phosphor powder composed of β-sialon phosphor particles in which Eu is solid-soluted in a crystal having a β-type $Si_3N_4$ crystal structure and has an aspect ratio of 2 or less, and substantially free of a phosphor particle having an aspect ratio exceeding 2. The β-sialon phosphor is preferably a β-sialon phosphor powder that is represented by the formula: $Si_{6-z}Al_zO_zN_{8-z}:Eu_x$ (wherein 0<z<4.2 and 0.005<x<0.08), consists of phosphor particles having a β-type $Si_3N_4$ crystal structure, is composed of phosphor particles having an aspect ratio of 2 or less, and is substantially free of a phosphor particle having an aspect ratio exceeding 2. Such a β-sialon phosphor powder has high fluorescence intensity and is easy to handle as a powder composed of a granular particle. If the powder contains a phosphor particle having an aspect ratio exceeding 2, the powder comes to exhibit a property of a powder containing an acicular particle, for example, have a large bulk density, and therefore, its handling becomes difficult.

Also, in the β-sialon phosphor powder, the average aspect ratio of constituent phosphor particles is preferably less than 1.5. When the average aspect ratio of the β-sialon phosphor particle is less than 1.5, the phosphor is assured of high fluorescence intensity and is good as a powder. The reason why the fluorescence intensity of a phosphor containing β-sialon having a small aspect ratio becomes high is considered because scattering of light is reduced as compared with a particle having a large aspect ratio. In turn, the absorptivity of excited light is enhanced, and a phosphor capable of releasing a high-intensity fluorescence results. Furthermore, most of conventional phosphor powders are granular and in mixing with such a powder, a granular crystal is more suited than a crystal having a large aspect ratio. If the average aspect ratio is 1.5 or more, the fluorescence intensity is decreased or a property of an acicular powder starts appearing.

Also, in the β-sialon phosphor powder, the median diameter ($D_{50}$) in the particle size distribution curve is preferably from 3.0 to 10 μm. The median diameter ($D_{50}$) is more preferably from 4.6 to 6.0 μm. If $D_{50}$ is less than 3 μm, the emission intensity decreases. This is considered to occur because defects on the particle surface are increased. On the other hand, if $D_{50}$ exceeds 10 μm, the emission intensity disadvantageously becomes non-uniform due to extreme light scattering and light absorption.

The β-sialon is a crystal liable to grow into a columnar-acicular shape having a large aspect ratio when the property inherent in the crystal is reflected. We attempted the production of a β-sialon phosphor by the method of Kokai No. 2005-255895, but as reported, only a columnar-acicular crystal having a large aspect ratio was obtained. Then, we attempted the production of a granular β-sialon phosphor by referring to the granular β-sialon reported in Powder Science and Engineering, Vol. 21, No. 8 (1989), but the phosphor that could be obtained was still only a β-sialon phosphor dominated by a columnar-acicular crystal. This is considered to result because the technique of Powder Science and Engineering, Vol. 21, No. 8 (1989) is performed not in a phosphor composition system but in an Si—Al—O—N composition system. In the case of a β-sialon phosphor, an element such as rare earth, an activation component, is added to thereby facilitate production of a liquid phase component, and the crystal growth more proceeds in a liquid phase, as a result, the crystal is liable to grow in a columnar-acicular shape, making it difficult to obtain a granular particle. In this way, a granular β-sialon phosphor is difficult to produce by the conventional production methods.

We have advanced intensive studies on crystallization of a β-sialon phosphor, as a result, it has been found that when the raw material silicon nitride is small in the particle diameter, a columnar-acicular crystal is produced, whereas when the silicon nitride reaches a sufficiently large size, a granular β-sialon phosphor is produced. This is because when the particle diameter of silicon nitride is small, the silicon nitride is dissolved in the produced liquid phase and crystal growth progresses to develop an acicular crystal, but when a large silicon nitride particle is used, the silicon nitride is not dissolved in the liquid phase component, and a β-sialon phosphor is produced while taking up the liquid phase component.

From this fact, it has been found that when the raw material α-type silicon nitride is sufficiently large, the form of silicon nitride is reflected in the particle form of β-sialon phosphor. By applying these findings, a silicon nitride raw material that is a very large particle and has a small aspect ratio is used, as a result, a β-sialon phosphor having a small aspect ratio can be obtained.

The production method of the β-sialon phosphor is described below.

The β-sialon phosphor is characterized by α-type silicon nitride serving as a raw material, and crystalline α-type silicon nitride having a particle diameter of 2 μm or more and an aspect ratio of 1.3 or less is used as a raw material. Such α-type silicon nitride can be obtained by thermally decomposing a nitrogen-containing silane compound and/or a non-crystalline (amorphous) silicon nitride powder. Examples of the nitrogen-containing silane compound include silicon diimide ($Si(NH)_2$), silicon tetraamide, silicon nitrogen imide and silicon chloroimide. These compounds are produced by a known method, for example, a method of reacting a silicon halide such as silicon tetrachloride, silicon tetrabromide or silicon tetraiodide with ammonia in a gas phase, or a method of reacting the silicon halide above in a liquid form with liquid ammonia. As for the amorphous silicon nitride powder, those produced by a known method, for example, a method of thermally decomposing the nitrogen-containing silane compound above at a temperature of 1,200 to 1,460° C. in a nitrogen or ammonia gas atmosphere, or a method of reacting a silicon halide such as silicon tetrachloride, silicon tetrabromide or silicon tetraiodide with ammonia at a high temperature, are used. The average particle diameter of the amorphous silicon nitride powder or nitrogen-containing silane compound is usually from 0.005 to 0.05 μm. The nitrogen-containing silane compound and amorphous silicon nitride powder are readily hydrolyzed or oxidized and therefore, these raw material powders are weighed in an inert gas atmosphere.

The objective α-type crystalline silicon nitride is obtained by firing the thus-produced nitrogen-containing silane compound and/or amorphous silicon nitride powder in a range of 1,300 to 1,550° C. under a nitrogen or ammonia gas atmosphere. The particle size is controlled by adjusting the conditions of firing (temperature and temperature-elevating rates). Particularly, for obtaining α-type silicon nitride having a large particle diameter, a temperature rise as slow as 20° C./hour is necessary. The α-type silicon nitride obtained in this way is, as shown in FIG. 1(a), in a state of large primary particles being substantially monodispersed, and an aggregated particle or a fused particle is scarcely present therein.

The thus-obtained α-type silicon nitride powder having a particle diameter (the size of a primary particle observed on SEM photograph; in the case of a columnar crystal, the length of a longest axis) of 2 μm or more and an average aspect ratio (ratio of long axis/short axis) of 1.3 or less, a substance containing AlN and serving as an aluminum source, and an oxide of Eu or a precursor substance capable of changing into an oxide of Eu upon thermal decomposition are mixed to give a desired composition of the formula: $Si_{6-z}Al_zO_zN_{8-z}:Eu_x$ (wherein $0<z<4.2$ and $0.005<x<0.08$).

Here, the substance containing AlN and serving as an aluminum source is an AlN powder alone, an AlN powder and an Al powder, or an AlN powder and a powder of an oxide of Al or a precursor substance capable of changing into an oxide of Al upon thermal decomposition, and serves as an Al source and/or a nitrogen or oxygen source of the β-sialon phosphor.

The precursor substances serving as an oxide of Al or an oxide of Eu upon thermal decomposition include nitride, hydroxide, carbonate and chloride of respective elements. Examples thereof include $Al_2O_3$ and $Al(OH)_3$. Also, examples of the oxide of Eu and the precursor substance capable of changing into an oxide of Eu upon thermal decomposition include $Eu_2O_3$, $EuCl_3$ and $Eu(NO_3)_3$. The europium oxide powder when fired at high temperature in a nitrogen atmosphere is reduced into a divalent oxide (EuO) and serves as a light emission source. The oxide of Al or the precursor substance capable of changing into an oxide of Al upon thermal decomposition, and the oxide of Eu or the precursor substance capable of changing into an oxide upon thermal decomposition each is preferably used in a powder state.

The method for mixing these starting materials is not particularly limited, and a known method such as a method of dry-mixing the starting materials or a method of wet-mixing them in an inert solvent substantially incapable of reacting with each component of the raw materials and then removing the solvent, may be employed. As for the mixing device, a V-shaped mixer, a rocking mixer, a ball mill, a vibration mill, a medium stirring mill or the like is suitably used.

The mixed powder obtained filled in a boron nitride-made crucible and fired at 1,700 to 2,100° C., preferably from 1,800 to 2,000° C., in a nitrogen-containing inert gas atmosphere at 0.05 to 100 MPa, whereby the objective β-sialon phosphor powder is obtained. If the firing temperature is less than 1,700° C., the production of a desired β-sialon phosphor requires heating for a long time, and this is not practical. Also, the production ratio of a β-sialon phosphor phase in the produced powder decreases. If the firing temperature exceeds 2,100° C., silicon nitride and sialon are sublimated and decomposed, and free silicon is disadvantageously produced. As for the firing vessel, a graphite-made crucible, a silicon carbide-made crucible, and a silicon nitride-made crucible may be used, other than a boron nitride-made crucible. In the case of a graphite-made crucible, the inner wall is preferably coated with silicon nitride, boron nitride or the like. A small amount of hydrogen, ammonia, hydrocarbon (e.g., methane, ethane) or carbon monoxide may be flowed in the atmosphere during firing.

The heating furnace used for firing of the powder mixture is not particularly limited and, for example, a batch electric furnace of high frequency induction heating system or resistance heating system, or a fluidized kiln can be used.

On the surface of the obtained β-sialon phosphor, a glass phase is sometimes attached to decrease the fluorescence intensity. In this case, after the firing, the obtained phosphor powder is subjected to an acid treatment in an acid-containing solution to remove the glass phase. In the acid treatment, the β-sialon phosphor is placed in an acid solution selected from sulfuric acid, hydrochloric acid and nitric acid, whereby the glass layer on the surface is removed. The acid concentration is from 0.1 to 7 N, preferably from 1 to 3 N. If the concentration is excessively high, oxidation proceeds significantly and good fluorescent characteristics cannot be obtained. In the acid solution having an adjusted concentration, the sialon powder is charged in a ratio of 5 wt % based on the solution and kept for a desired time while stirring. After washing, the solution containing sialon is filtered, and the obtained sialon is washed with water to remove the acid and then dried. The glass phase on the surface is removed by the acid treatment, and the fluorescence intensity is enhanced.

Also, in the β-sialon phosphor after firing, a defect is sometimes introduced and the fluorescence intensity decreases. In this case, after the firing, the obtained phosphor powder is preferably heat-treated within a temperature range of 300 to 1,000° C. By the annealing treatment at a temperature of 300 to 1,000° C., a harmful defect that absorbs the released fluorescence is removed, as a result, the fluorescence intensity is enhanced. Heat treatment at a temperature lower than 300° C. is less effective in removing a surface defect, whereas heat treatment at more than 1000° C. is not preferred, because the powder is fused. The heat treatment above is preferably performed in an atmosphere containing one member or a mixture of two or more members selected from nitrogen, ammonia and hydrogen.

The β-sialon phosphor powder is kneaded with a transparent resin such as epoxy resin or acrylic resin by a known method to produce a coating agent. A light emitting diode capable of emitting excitation light is coated with the produced coating agent, thereby forming a light emitting diode of photoconversion type, and this light emitting diode is used as a lighting apparatus. It is also possible to form a thin plate containing the oxynitride phosphor, dispose the plate to absorb light of a light emitting diode serving as an excitation source, thereby producing a light emitting diode of photoconversion type, and utilize it as a lighting apparatus. As for the wavelength of the light emitting diode serving as an excitation source, to make use of the characteristics of the β-sialon phosphor, a light emitting diode capable of emitting light at a wavelength of 300 to 500 nm is preferred, and light in a ultraviolet-to-blue wavelength region of 300 to 470 nm is more preferred. The β-sialon phosphor emits green fluorescence but can also be used by mixing it with a phosphor capable of emitting light of other colors, for example, a yellow-emitting phosphor, an orange-emitting phosphor, a red-emitting phosphor or a blue-emitting phosphor. When these phosphors are mixed, a green component in the released light is increased by the phosphor, and the color tone can be controlled.

In addition, an image display device can be produced using the oxynitride phosphor and an excitation source. In this case, not only a light emitting diode but also a light source capable of emitting an electron beam, an electric field, a vacuum ultraviolet ray or an ultraviolet ray are employed as the excitation source. The β-sialon phosphor powder is characterized by causing no brightness reduction with these excitation sources and thus, is applicable to a fluorescent display tube (VFD), a field emission display (FED), a plasma display panel (PDP) and a cathode ray tube (CRT).

EXAMPLES

Working examples are described below.

Example 1

First, an α-type silicon nitride is produced. The method therefor is as follows. Silicon tetrachloride and ammonia were reacted to produce silicon diimide, and the silicon diimide was decomposed under heating at 1,100° C. in a nitrogen gas atmosphere to obtain an amorphous silicon nitride powder. The amorphous silicon nitride obtained was charged into a carbon-made crucible, and the temperature was raised to 1,200° C. from room temperature over 1 hours, raised to 1,400° C. from 1,200° C. at 20° C./h, raised to 1,500° C. from 1,400° C. over 1 hours, and kept at 1,500° C. for 1 hour. FIG. 1A shows particles of the α-type silicon nitride obtained. The particle diameter was from 5.6 to 8.0 μm, and the aspect ratio (long axis/short axis) was from 1.0 to 1.2.

Using this silicon nitride, a silicon nitride powder, an aluminum nitride powder, an aluminum oxide powder and an europium oxide powder were weighed to give a composition of $Si_{5.631}Al_{0.369}O_{0.369}N_{7.631}:Eu_{0.0244}$, put in a polyethylene-made pot and mixed by a vibration mill for 1 hour. The resulting mixed powder was put in a boron nitride-made crucible, and the crucible was set in an ambient pressure-type electric furnace. After vacuumization by an oil-sealed rotary pump, nitrogen of 99.999% purity was introduced to a pressure of 0.8 MPa, and the temperature was raised to 1,900° C. over 4 hours in total, that is, to 1,000° C. over 1 hour, to 1,200° C. over 1 hour and to 1,900° C. over 2 hours, and kept at 1,900° C. for 3 hours. After furnace cooling, the crucible was taken out, and the sample synthesized was lightly ground and measured by powder X-ray diffractometry (XRD).

Figure 1B:
FIG. 1B is a scanning electron micrograph showing particles of β-sialon phosphor produced in Example 1.

The measurement revealed that this sample was a β-sialon having a β-type silicon nitride structure. Next, the form of the powder was observed by a scanning electron microscope (SEM). FIG. 1B shows the results. The particle was granular. The size of the particle and the aspect ratio (ratio of long axis/short axis) of the particles were measured excluding fine particles broken by grinding, apparently fused particles and the like, as a result, the particle size was from 3.0 to 7.5 μm and the aspect ratio was from 1.0 to 1.8. The aspect ratio was 2 or less in all β-sialon phosphor particles. The average aspect ratio was calculated and resulted in 1.3. The particle size distribution was measured using a laser diffraction/scattering particle size distribution measuring apparatus, and $D_{50}$ was found to be 5.8 μm.

In this way, when a β-sialon phosphor was synthesized using α-type silicon nitride having a large particle diameter and a small aspect ratio, a sialon phosphor having an unprecedentedly small aspect ratio could be produced.

When an ultraviolet ray at a wavelength of 365 nm was irradiated on this powder, emission of green light was confirmed. The particle diameter and aspect ratio of the raw material α-type silicon nitride, the form, particle diameter (in the case of an acicular particle, longest axial diameter and shortest axial diameter), aspect ratio and average aspect ratio of the β-sialon phosphor obtained, $D_{50}$ of the oxynitride phosphor powder mainly composed of β-sialon phosphor, the fluorescence intensity ratio (to Comparative Example 2 taken as 100), and the light absorption ratio (to Comparative Example 2 taken as 100) are shown in Table 1. The phosphor particle containing a granular β-sialon phosphor particle is improved in the light absorption and fluorescence intensity.

Examples 2 and 3

β-Sialon phosphors were produced by the same method as in Example 1 except for changing the particle diameter of α-type silicon nitride used.

Figure 2A:
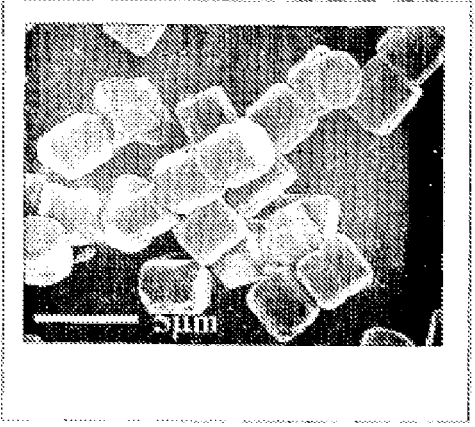
FIG. 2A is a scanning electron micrograph showing particles of α-type silicon nitride as a raw material Example 2.
Figure 2B:
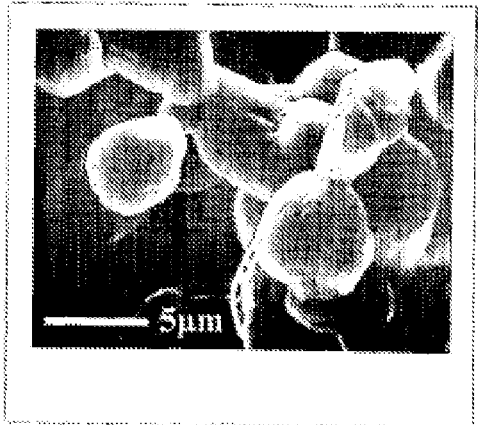
FIG. 2B is a scanning electron micrograph showing particles of β-sialon phosphor produced in Example 2.

The results are shown in Table 1. FIG. 2A illustrates the form of the raw material α-type silicon nitride of Example 2, and FIG. 2B illustrates the obtained β-sialon phosphor.

Example 4

1 Gram of β-sialon obtained in Example 1 and 50 g of a 2 N nitric acid solution were put in a beaker and stirred for 5 hours. Thereafter, the solution was filtered and washed with water, and the residue was collected and dried at 120° C. The fluorescent characteristics of this powder are shown in Table 1. The fluorescence intensity is enhanced by acid washing.

Example 5

1 Gram of β-sialon obtained in Example 1 was put in an alumina crucible and heat-treated at 500° C. for 1 hour in a 0.1 MPa nitrogen atmosphere. After furnace cooling, the sample was taken out and evaluated for fluorescent characteristics. The results are shown in Table 1. The fluorescent characteristics are enhanced by the heat treatment.

Comparative Examples 1 and 2

β-Sialon phosphors were produced by the same method as in Example 1 except for replacing the α-type silicon nitride used by ones having a small particle diameter.

The results are shown in Table 1. In Comparative Example 1, crystalline α-type silicon nitride of 0.12 to 0.5 μm was used as the silicon nitride.

Figure 3A:
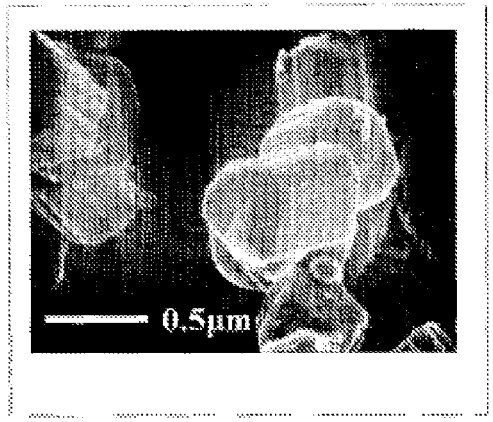
FIG. 3A is a scanning electron micrograph showing particles of α-type silicon nitride as a raw material in Comparative Example 1.
Figure 3B:
FIG. 3B is a scanning electron micrograph showing particles of β-sialon phosphor produced in Comparative Example 1.

FIG. 3A illustrates the raw material α-type silicon nitride. The particles of the β-sialon phosphor obtained were acicular and the aspect ratio thereof was from 5 to 10. The average aspect ratio turned out to be 7.4. FIG. 3B illustrates the crystal form of the β-sialon obtained. In Comparative Example 2, fine particulate α-type silicon nitride of 0.1 to 0.27 μm was used as the silicon nitride.

Figure 4A:
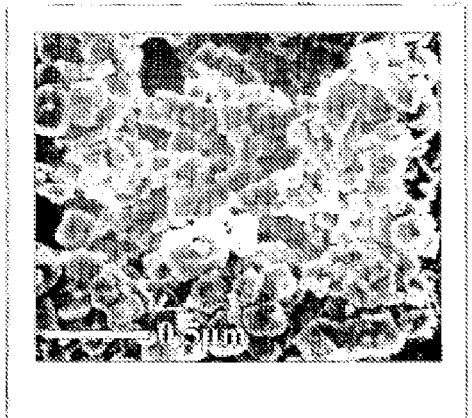
FIG. 4A is a scanning electron micrograph showing particles of α-type silicon nitride as a raw material in Comparative Example 2.
Figure 4B:
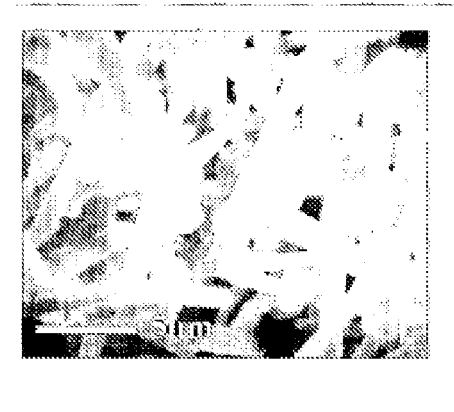
FIG. 4B is a scanning electron micrograph showing a particle of β-sialon phosphor produced in Comparative Example 2.

FIG. 4A illustrates the raw material silicon nitride. The particles of the obtained β-sialon phosphor were acicular and the aspect ratio thereof was from 8.2 to 15. FIG. 4B illustrates the crystal form of the β-sialon obtained. Incidentally, in the case where the β-sialon phosphor particles are columnar-acicular, the diameter of a largest particle and the diameter of a smallest particle are shown as the particle diameter, and therefore, the particle diameter of Table 1 does not indicate the size of one particle.

INDUSTRIAL APPLICABILITY

The β-sialon phosphor particle is expected as a phosphor assured of excellent fluorescence intensity and little brightness reduction and is usable for a fluorescent display tube (VFD), a field emission display (FED), a plasma display panel (PDP), a cathode ray tube (CRT), a light emitting diode (LED) and the like.

The invention claimed is:

1. β-sialon phosphor particles in which Eu (europium) is solid-soluted in a crystal having a β-type $Si_3N_4$ crystal structure, wherein the particles are crystal particles obtained by firing raw materials, the crystal particles having a particle size of 3.0 μm 12 μm and an aspect ratio less than 1.5.

2. The β-sialon phosphor particles as claimed in claim 1, wherein said β-sialon phosphor is represented by the formula: $Si_{6-z}Al_zO_zN_{8-z}:Eu_x$ (wherein 0<z<4.2 and 0.005<x<0.08).

3. A method for producing the β-sialon phosphor particles claimed in claim 1, comprising mixing α-type silicon nitride particles with the primary particles having a particle diameter of 2 μm or more and an average aspect ratio of 1.3 or less, a substance containing AlN and serving as an aluminum source, and an oxide of Eu or a precursor substance capable of changing into an oxide of Eu upon thermal decomposition, to satisfy the formula: $Si_{6-z}Al_zO_zN_{8-z}:Eu_x$ (wherein 0<z<4.2 and 0.005<x<0.08). and firing the mixture at 1,700 to 2,100° C. in a nitrogen atmosphere at 0.05 to 100 MPa.

4. The method for producing a β-sialon phosphor powder as claimed in claim 3, wherein a washing treatment in a solution containing an acid is applied after the firing.

5. The method for producing a β-sialon phosphor powder as claimed in claim 3, wherein after the firing, a heat treatment is performed within a temperature range of 300 to 1,000° C. in an atmosphere containing one member or two or more members selected from nitrogen, ammonia and hydrogen.

6. A lighting apparatus comprising an LED capable of emitting light at a wavelength of 300 to 500 nm and the β-sialon phosphor particles powder claimed in claim 1, which is disposed to absorb light of said LED.

7. An image display device comprising an excitation source and the β-sialon phosphor particles claimed in claim 1.

8. The image display device as claimed in claim 7, wherein the excitation source is an electron beam, an electric field, a vacuum ultraviolet ray or an ultraviolet ray.

TABLE 1

| | Raw Material Silicon Nitride | | β-Sialon Phosphor Powder | | | | | |
|---|---|---|---|---|---|---|---|---|
| | | | β-Sialon Phosphor Particle | | | | | |
| | Particle Diameter (μm) | Aspect Ratio | Form | Particle Diameter (μm) | Aspect Ratio | Average Aspect Ratio | $D_{50}$ (μm) | Fluorescence Intensity Ratio | Light Absorptivity Ratio |
| Example 1 | 5.6-8.0 | 1.0-1.2 | granular | 3.0-7.5 | 1.0-1.8 | 1.3 | 5.8 | 131 | 110 |
| Example 2 | 2.7-3.3 | 1.0-1.2 | granular | 4.7-9.4 | 1.0-1.7 | 1.3 | 5.0 | 127 | 108 |
| Example 3 | 2.0-3.0 | 1.0-1.3 | granular | 3.4-12 | 1.1-1.8 | 1.4 | 4.6 | 120 | 105 |
| Example 4 | — | — | — | — | — | — | — | 139 | 113 |
| Example 5 | — | — | — | — | — | — | — | 148 | 118 |
| Comparative Example 1 | 0.12-0.5 | 1.1-1.3 | acicular | longest axial diameter: 10.3 shortest axial diameter: 0.6 | 5.0-10 | 7.4 | 1.4 | 102 | 100 |
| Comparative Example 2 | 0.1-0.27 | 1.0-1.5 | acicular | longest axial diameter: 13.3 shortest axial diameter: 0.7 | 8.2-15 | 9.4 | 1.1 | 100 | 100 |

9. The method for producing a β-sialon phosphor powder as claimed in claim 4, wherein after the firing, a heat treatment is performed within a temperature range of 300 to 1,000° C. in an atmosphere containing one member or two or more members selected from nitrogen, ammonia and hydrogen.

* * * * *